United States Patent
Kohnle et al.

(10) Patent No.: US 8,202,567 B2
(45) Date of Patent: Jun. 19, 2012

(54) METHOD OF MANUFACTURING PATTERN-FORMING METAL STRUCTURES ON A CARRIER SUBSTRATE

(75) Inventors: Franz Kohnle, Berlin (DE); Michael Guggemos, Stahnsdorf (DE); Matthias Dammasch, Berlin (DE); Wolfgang Ptak, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 702 days.

(21) Appl. No.: 12/063,271

(22) PCT Filed: Aug. 4, 2006

(86) PCT No.: PCT/EP2006/007734
§ 371 (c)(1),
(2), (4) Date: Feb. 8, 2008

(87) PCT Pub. No.: WO2007/017192
PCT Pub. Date: Feb. 15, 2007

(65) Prior Publication Data
US 2010/0136252 A1   Jun. 3, 2010

(30) Foreign Application Priority Data
Aug. 9, 2005  (DE) .................. 10 2005 038 392

(51) Int. Cl.
*B05D 5/12*  (2006.01)
(52) U.S. Cl. .............. 427/98.4; 427/98.5; 427/98.6; 427/304
(58) Field of Classification Search .......... 427/98.4, 427/98.5, 98.6, 304
See application file for complete search history.

(56) References Cited

U.S. PATENT DOCUMENTS

| | | | | |
|---|---|---|---|---|
| 3,432,337 A | * | 3/1969 | Groschopp et al. | 427/353 |
| 3,575,838 A | * | 4/1971 | Hughes | 204/490 |
| 3,801,364 A | * | 4/1974 | Kojima et al. | 427/97.5 |
| 4,252,672 A | * | 2/1981 | Smith | 502/5 |
| 4,355,083 A | * | 10/1982 | Feldstein | 428/621 |
| 4,404,237 A | * | 9/1983 | Eichelberger et al. | 427/97.5 |
| 4,652,305 A | * | 3/1987 | Ebenhoech et al. | 75/362 |
| 5,709,832 A | * | 1/1998 | Hayes et al. | 264/272.11 |
| 6,261,644 B1 | * | 7/2001 | Nittel et al. | 427/437 |
| 2002/0169244 A1 | * | 11/2002 | Ostertag et al. | 524/440 |
| 2003/0106204 A1 | * | 6/2003 | Ferguson et al. | 29/601 |
| 2003/0169207 A1 | * | 9/2003 | Beigel | 343/718 |

(Continued)

FOREIGN PATENT DOCUMENTS

DE   35 15 985   3/1985

(Continued)

OTHER PUBLICATIONS

International Search Report and Written Opinion, Application No. PCT/EP2006/007734, mailed Nov. 21, 2006.

(Continued)

*Primary Examiner* — Brian K Talbot
(74) *Attorney, Agent, or Firm* — Renner, Otto, Boisselle & Sklar, LLP

(57) ABSTRACT

To improve the transmission properties of antennae manufactured with known methods, more specifically antennae for application in the UHF range, a method is proposed of producing pattern-forming metal structures on a carrier substrate. The method comprises the following method steps: providing the carrier substrate, forming the pattern on the carrier substrate with a composite material containing dispersed metal, bringing the carrier substrate into contact with halide ions, and thereafter depositing a metal layer onto the pattern formed by the composite material, producing thereby metal structures.

28 Claims, 1 Drawing Sheet

U.S. PATENT DOCUMENTS

2004/0090380 A1* 5/2004 Luch ........................ 343/700 MS
2005/0133375 A1* 6/2005 Schmid et al. ................ 205/135

FOREIGN PATENT DOCUMENTS

GB           1160730      12/1966

OTHER PUBLICATIONS

Notification of Transmittal of International Preliminary Report on Patentability, Application No. PCT/EP2006/007734, mailed Oct. 18, 2007.

* cited by examiner

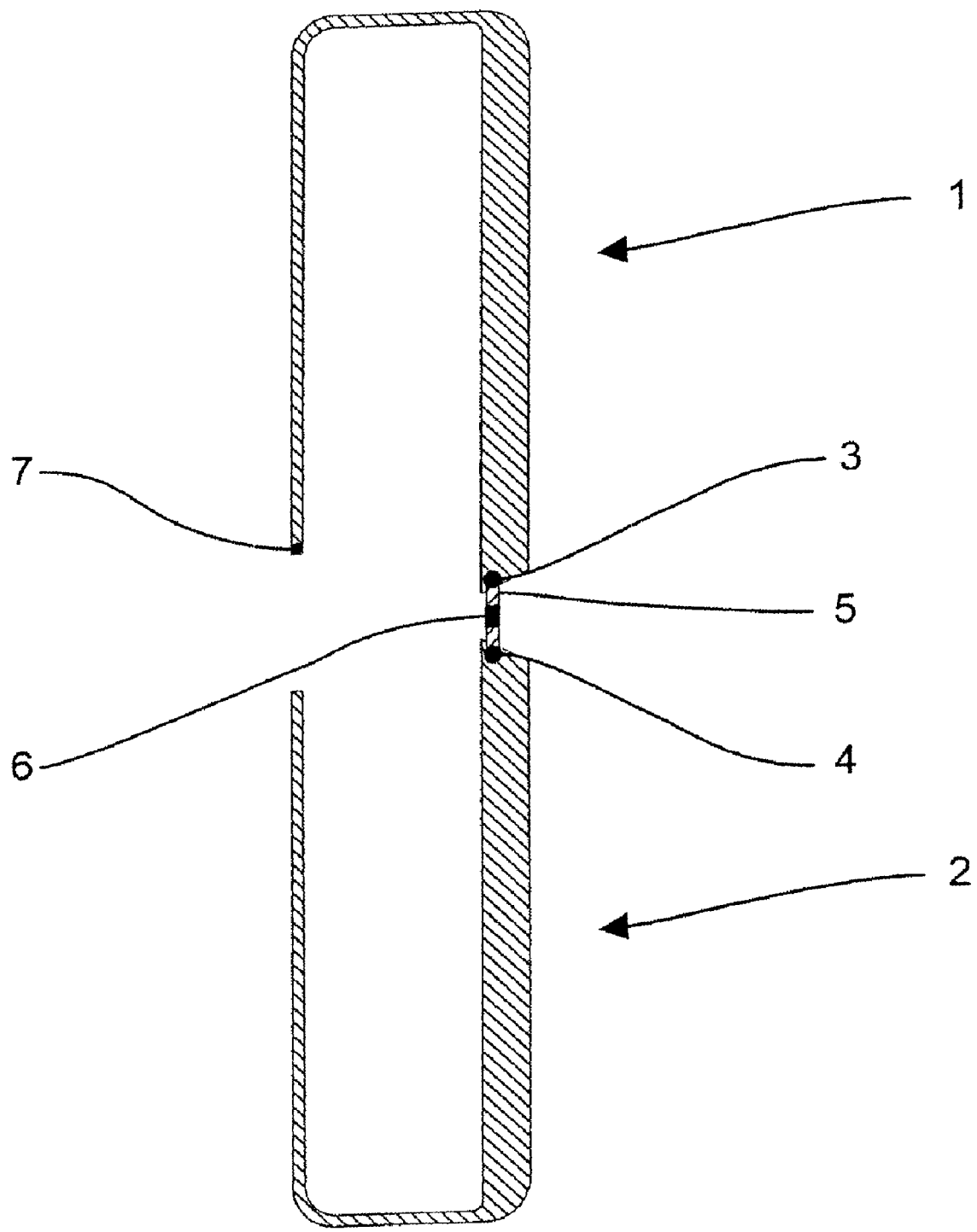

METHOD OF MANUFACTURING PATTERN-FORMING METAL STRUCTURES ON A CARRIER SUBSTRATE

The present invention relates to a method of manufacturing pattern-forming metal structures on a carrier substrate, more specifically for manufacturing an antenna for RFID (Radio Frequency Identification) operating in the UHF range.

For several decades, RFID has been a technique for non-contact electronic anti-theft devices in warehouses (EAS: electronic article surveillance). In the simplest case, a device suited for RFID applications consists of the antennae of a reader or of a detector as well as of a safety means or tag which is also referred to as a transponder. The reader thereby serves both for producing an electromagnetic field and for detecting the field modified by the transponder. In this case, the transponder utilized is an LC oscillator influencing by resonance effects the alternating magnetic field of the reader as it passes in front of the antennae thereof. As a result, the voltage drop in a generator coil in the reader changes slightly, thus indicating the presence of the transponder in the alternating field of the reader. Such type 1-bit transponders however are only suited for the applications mentioned or for similar ones.

For other applications, for example for use in the identification of banknotes, animals, patients, in goods and inventory management, as an access system, in position identification and as an electronic immobilizer system, the preceding 1-bit transponders are not suited as they only contain the information "present" or "not present", but no more complex information. For these purposes, the transponders must have data carriers for storing the information desired. Usually, an electronic semiconductor memory (chip) is used as the data carrier. To allow for reading the stored information out of the data carrier, the transponder must be placed in proximity to the reader. It is also known to provide a battery for the transponder to operate the chip. This however is expensive and hence not possible for many applications. Therefore, the energy stored in the electromagnetic field transmitted by the reader can be used instead of an electric battery. For this purpose, the energy absorbed by the antenna of the transponder is rectified and supplied to the chip.

In many cases, the reader has been using alternating fields in a frequency range of up to several ten MHz. The frequency typically used is 13.56 MHz. The wavelength of such radiation ranges from several ten up to several thousand meters (13.56 MHz: 22.1 m). Since, when using electromagnetic radiation at a frequency of 13.56 MHz, the transponder itself typically still is in the near field of the reader, the field emitted by the reader at the site of the transponder is to be considered an alternating magnetic field. Accordingly, power transmission between the antennae of the reader and the transponder is achieved in similar fashion as with the 1-bit transponder. The alternating magnetic field is influenced by load modulation in the transponder so that the change induced by load modulation is also detectable in the reader. This load modulation carries the information delivered by the chip.

The RFID systems, which operate in the frequency range of up to several ten MHz, require quite large antennae. Moreover, the efficiency of this technique is quite low. This however is disadvantageous in many applications. Therefore, systems have been developed, which operate in the UHF frequency range (UHF: ultra high frequency, frequency thereof being in general to be understood to range from 0.3 to 3 GHz, wavelength: 10 cm-1 m). The UHF frequencies reserved for RFID are 868 MHz in Europe and 915 MHz in the USA. Since the distance separating the transponder from the reader is in this case considerably greater than the wavelength, the antenna of the transponder is not in the near field of the emitting antenna of the reader. Consequently, the field emitted by the reader at the site of the transponder cannot be considered to be an alternating magnetic field. The electromagnetic radiation emitted by the reader is rather reflected by the antenna of the transponder. By changing a load resistance in the transponder, its reflection capacity can be modified so that the information stored in the chip is modulated to the reflected electromagnetic radiation and can thus be received by the reader.

Numerous proposals have been made to manufacture transponders for RFID applications. In a lot of cases, one of the most important appraisal criteria of the method has been the low cost manufacturing of the antenna structures. Many proposals have been made in this regard:

DE 102 29 166 A1 for example indicates a method of manufacturing a structured metal layer which comprises at least the following steps: providing a cathode on the surface of which conductive and non-conductive areas forming a mask structure are defined and an anode, said cathode and said anode being disposed in an electrolyte which contains a substrate metal, applying a voltage between the cathode and the anode, depositing the substrate metal onto the conductive areas of the cathode, providing a carrier layer and bringing said carrier layer into contact with the surface of the cathode as well as transferring the substrate metal deposited onto the cathode onto the carrier layer, with the structured metal layer being preserved. For this purpose, a stainless steel drum, which is provided with a mask structure made from plastic material or ceramics, is used as the cathode for example. The copper structure formed by depositing copper onto the drum is provided with an adhesive and then pressed against a paper or plastic foil web as the carrier layer, with the copper structure being transferred to the web.

DE 101 45 749 A1 discloses a method of manufacturing a metal layer on a carrier body wherein an adhesive layer is applied at least partially on a surface of said carrier body, a metal foil or metal powder being deposited onto the surface of the carrier body provided with the adhesive layer, said metal foil or powder being fixed to said adhesive layer and then the areas of the metal foil or powder that are not adhering to the adhesive layer being mechanically removed so that only the areas of the metal foil or powder adhering to the adhesive layer remain as a structure on the carrier body. For this purpose, a carrier body made of plastic is for example provided with an adhesive. Then, a metal foil, of copper for example, is applied to the adhesive layer. Next, the copper layer that has been applied to carrier areas that have not been coated with an adhesive are mechanically removed, such as by brushing. The structured copper layer can be reinforced chemically and/or by electroplating. In an alternative variant of the method, the metal layer may also be applied by pressing it onto a plastic foil, a structured stamp being used for this purpose. The metal layer adheres in the areas in which the stamp presses the metal layer onto the plastic foil. Then, the metal layer that has not been pressed on is removed mechanically, such as by brushing.

In DE 100 65 540 A1 there is described a method of manufacturing a strip conductor on a substrate wherein the strip conductor is sprayed thereon as a metal particle suspension using a mask or a focussing spray device. The metal particle suspension contains at least a fraction of copper particles. The suspension is a kind of lacquer that is sprayed with progressively increasing thickness onto the surface of the substrate.

DE 101 24 772 C1 indicates a method for forming an antenna mounted to a semiconductor chip wherein a structured antenna layer made from a solder material is formed in the shape of an antenna on a carrier with said semiconductor chip being applied thereafter onto said carrier and soldered to said antenna layer and said antenna layer molten to form the antenna. A solder paste containing preferably solder particles made from a material having at least approximately a eutectic composition, for example an alloy or an intermetallic compound containing at least one of the elements from the group Sn, In, Bi and Ga, is used for this purpose. The solder paste is printed onto said carrier.

DE 101 45 750 A1 describes a method of manufacturing a metal layer on a carrier body wherein conductive particles are applied to a surface of the carrier body so as to be fixed thereon and said carrier body with the particles is metal plated chemically and/or by electroplating in a metal plating bath to form the metal layer. For this purpose, a structured adhesive layer onto which the conductive particles such as copper or iron particles are fixed is first deposited onto the carrier body for example. Then, the carrier body with the particles fixed to the adhesive layer are placed into a metal plating bath, a metal layer forming chemically and/or by electroplating on the juxtaposed particles. Rather than the adhesive layer, a carrier body provided with adhesive properties may also be used. The metal layer produced chemically and/or by electroplating may for example be a copper layer.

DE 102 54 927 A1 discloses a method of manufacturing conductive structures on a carrier wherein a surface of the carrier is first at least partially covered with conductive particles, next a passivation layer is deposited onto the particle layer formed by the conductive particles, with said passivation layer being formed as a negative of the conductive structure and finally the conductive structure being formed in the areas that have not been covered with the passivation layer. For this purpose, a non conductive layer preferably made from iron particles is first blown, sprayed or printed onto the entire surface of the carrier. There would be no electric conductivity between neighboring conductive particles as these would have a non conductive surface. The particles adhere to the carrier by means of an adhesive for example. Next, the passivation layer is applied, such as by printing. The bare areas may then be copper plated with a copper bath by ion exchange where the not so noble iron is exchanged for the nobler copper.

DE 35 15 985 A1 relates to the manufacture of a solderable coating on a substrate, the method comprising applying a layer of solderable metal in the form of conductor strips and/or contact areas onto an electrically isolating substrate. The method comprises applying a first layer of an electrically conductive varnish in the form of conductor strips and/or contact areas onto the substrate, the varnish containing inter alia metal particles, curing the first layer and immersing the substrate carrying the cured first layer into a solution containing ions of a solderable metal for chemically depositing a second layer of metal onto the first layer. The metal particles in the varnish may be for example iron particles. The solution may be acidic and may contain sulfuric acid and copper ions for example. The solution may alternatively be a copper chloride solution.

The problem underlying the present invention is that the transmission properties of the antennae manufactured using the known methods are not satisfactory, in particular if used in the UHF range.

It is therefore an object of the present invention to provide a method for manufacturing pattern-forming metal structures on a carrier substrate.

More specifically, it is an object of the present invention to provide a method for manufacturing pattern-forming metal structures on a carrier substrate to be used as an antenna for RFID operation.

It is a further object of the present invention to provide a method for manufacturing pattern-forming metal structures on a carrier substrate to be used as an antenna for RFID operation using radiation in the UHF or MW frequency range.

It is a further object of the present invention to provide a method for manufacturing pattern-forming metal structures on a carrier substrate to be used as an antenna for RFID operation, which antenna permits to very reliably achieve a sufficiently large transmission distance between a reader actively emitting RFID radiation and a transponder in which the antenna is used to receive and emit the RFID radiation.

It is still a further object of the present invention to provide a method for manufacturing pattern-forming metal structures on a carrier substrate used as an antenna for RFID operation, using a low-cost manufacturing method suited for mass production of transponders.

It is still a further object of the present invention to provide a method for manufacturing pattern-forming metal structures on a carrier substrate, wherein the method is very reliable, in particular under production conditions.

It is still a further object of the present invention to provide a method for manufacturing pattern-forming metal structures on a carrier substrate, wherein the method permits to manufacture the metal structures to be sufficiently adherent to the substrate.

These objects are achieved by the method according to claim 1. Preferred embodiments of the invention are indicated in the subordinate claims.

The most important aspect of the present invention refers to a method of manufacturing pattern-forming metal structures on a carrier substrate.

A further aspect of the present invention refers to a method of manufacturing pattern-forming metal structures on a carrier substrate which are used as an antenna for RFID applications, preferably for UHF or MW operation.

The method of the invention for manufacturing pattern-forming metal structures on a carrier substrate comprises the following method steps:
   a. providing the carrier substrate,
   b. forming the pattern on the carrier substrate using a composite material which contains dispersed metal,
   c. bringing the carrier substrate into contact with halide ions; and
   d. thereafter depositing a metal layer, more specifically a copper layer, onto the pattern formed by the composite material, so that metal structures are produced.

The method of the invention serves in particular to manufacture antennae for RFID applications, mainly in the UHF range. An antenna structure provided for this purpose is for example in the form of two U-shaped branches with the length of the respective legs of the branches being for example just under 10 cm, each leg of the two branches being connected with a special semiconductor component which comprises the electric circuit needed for operating a transponder. For connection of the semiconductor component to the antenna structure, connecting pads may be provided at each leg at which the semiconductor component is contacted such as by bonding, either directly or through chip carrier strips (interposer, strap, flip chip packages).

The method of the invention has the advantage that it permits to very reliably achieve a sufficiently large transmission distance between a reader actively emitting the RFID radiation and the transponder even if operated in the UHF and the MW range. UHF as used herein according to the invention refers to electromagnetic radiation in a frequency range of from about 500 MHz to about 1.5 GHz. MW as used herein according to the invention refers to microwave radiation, i.e., electromagnetic radiation at a frequency in excess of about 1.5 GHz. A large transmission distance, for example a distance of up to 3 m, is already achieved at quite low a radiation power of the reader of about 500 mW. With an UHF antenna etched out of conventional copper clad material (5 μm, 15 μm or 35 μm copper layer thickness) or with a UHF antenna made from copper chemically deposited onto catalytic pastes or with a UHF antenna made solely from a silver paste or with a UHF antenna built chemically and electrolytically with a copper layer thickness of 5 μm, 10 μm, 15 μm or 30 μm having the same design, so large a transmission distance has only been achieved in singular cases and was not reproducible.

Moreover, the method is extremely cost-effective since the materials utilized are quite cheap and because the method can be carried out on a large technical scale with good reproducibility.

The halide ions preferably are chloride ions, bromide ions or iodide ions, more specifically chloride ions. The halide ions may for example be provided by a halide salt. The halide salt may for example be an alkaline salt, an alkaline earth salt or a heavy metal salt, more specifically iron(II) and/or iron(III) salt.

The halide ions contained in a solution, the pre-immersion solution, possibly containing additionally at least one acid. The pre-immersion solution is preferably aqueous. The acid may in particular be a mineral acid, but basically also an organic acid. The mineral acid may more specifically be sulfuric acid. If the mineral acid is hydrochloric acid, another halide ion source can be dispensed with.

A preferred embodiment of the pre-immersion solution is an aqueous solution of iron(III) chloride, which may contain sulphuric acid in particular. Alternatively, an aqueous solution may be utilized which contains iron(II) sulphate and an alkali chloride salt such as sodium chloride as well as an acid such as sulfuric acid.

The pre-immersion solution is operated at an increased temperature preferably ranging for example from about 30 to about 70° C., more preferably from about 40 to about 50° C.

If the pre-immersion solution containing the halide ion source is, according to the method of the invention, used separately for pre-treating the pattern formed by the composite material, a large transmission distance from a reader to the transponder is achieved in UHF and MW operation even if the radiation power of the reader is set to be quite low, for example to about 500 mW. It has emerged in this case that the electric resistance of the antenna structure is quite low and that it amounts to 1 to 5Ω typically depending on the design of the antenna structure. Moreover, the deposited metal layer is well adherent to the composite material: performing a peel test using an adhesive tape does not destroy the metal layer on the composite material. Hence the electric resistance is not impaired.

However, if the pattern would be contacted with the halide ions concurrently with and not prior to metal deposition, by combining method steps c) and d), the electric resistance of the pattern is higher by a factor of 10-100 than when the carrier substrate is brought into contact with halide ions prior to metal deposition. In addition, in such case the deposited metal layer does not sufficiently strongly adhere to the composite material. If a peel test is performed the metal layer may virtually completely be peeled off the composite material and sticks to the tape used to perform the peel test. Accordingly the electric conductivity of the pattern is impaired. The insufficient adherence of the deposited metal layer to the composite material on the carrier substrate renders such a pattern useless since, in addition to the required large transmission distance in UHF and MW operation, also a minimum of robustness of the transponder vis-à-vis mechanical exposure is required if the transponder is used as non-contact tags.

If the carrier substrate is not at all brought into contact with halide ions only a very short transmission distance is achieved. This will exclude transponders manufactured accordingly to be reasonably used in UHF and MW operation. It has been found that the electric resistance of the antenna structure is quite high in this case, whilst it is very low if the method of the invention performing four method steps is carried out, said electric resistance then being for example lower by approximately a factor of 100-1000 than when the pattern is not brought into contact at all with the halide ions.

However, it appears that it will not suffice to minimize the electric resistance to achieve a large transmission distance since the deposition of a thick copper layer onto the pattern formed by the composite material will not yield satisfactory efficiency of the antenna structure.

Further it has emerged that bringing the substrate which carries the composite material pattern into contact with a pre-immersion solution containing halide ions is advantageous compared to bringing the substrate into contact with halide during the metal deposition step instead, without prior contacting it with a halide containing pre-immersion solution. This results from the fact that the achievable transmission distance will be higher and the adherence of the metal structures manufactured on the carrier substrate will be higher in the first case than in the second case.

In method step d), the metal is preferably deposited by means of charge exchange reaction. The metal thereby deposits onto the pattern formed by the composite material whilst dispersed metal contained in the composite material is concurrently dissolved.

The deposited metal is more specifically copper. Particularly high electric conductivity of the pattern coated with the copper layer is obtained if the copper is deposited by means of an acidic solution which contains copper ions. More specifically, a sulfuric acidic copper sulfate solution may be utilized for deposition. It has further been found advantageous to deposit copper more specifically by charge exchange reaction by means of a solution containing at least one complexing agent for copper. The complexing agent may form complexes more specifically in the acidic or in the alkaline medium. In the acidic medium, a phosphonic acid complexing agent such as 1-hydroxyethylidene-1,1-diphosphonic acid and in the alkaline medium triethanolamine can be utilized in particular as the complexing agent.

Copper is deposited onto the composite material preferably with a thickness not exceeding 5 μm, more preferably with a thickness not exceeding 2 μm and even more preferably with a thickness ranging from 0.8 to 1.8 μm.

It has been found that the transmission distance is very dependent on the thickness of a deposited copper layer. If the copper layer is too thick, for example 10 μm thick, the electric conductivity of the antenna structure formed is very high. The achievable transmission distance however is quite low and decreases even further with increasing thickness of the copper layer.

If, by contrast, no metal is deposited onto the pattern formed by the composite material and if the composite material filled with the dispersed metal is used alone for forming an antenna structure, no signal can be transmitted at all. For this reason on the one side, a metal coating must be provided to the pattern. On the other side, a coating with a small coating thickness is advantageous.

Selecting the metal dispersed in the composite material, it has been found that it should be less noble than the metal deposited in method step d, preferably copper. Particularly advantageous dispersed metals are selected from the group comprising iron, iron base alloys, zinc and zinc base alloys, preferably if copper is the metal deposited in method step d). Iron, in particular high-purity iron, is a particularly advantageous dispersed metal. For manufacturing the composite material, an iron powder made from iron carbonyl has been found advantageous. The method utilized for this purpose is similar to the Mond process developed for nickel powder made from nickel carbonyl. This powder may in particular have a particle size not exceeding about 6 µm. The coating thickness of the pattern formed by the composite material is for example about 10 µm directly after printing. Under these conditions in particular, a particle size not exceeding about 6 µm is to be preferred.

In addition to the dispersed metal, the composite material may also contain electrically conductive carbon particles such as conductive soot particles and carbon black particles. These particles advantageously influence for example the printability of the composite material.

The composite material may contain at least one binder which is selected from the group comprising epoxy resins, polyurethane resins and acrylic resins. For this purpose, a polymer binder system may for example be used, as it is also contained in a commercially available screen printing dye. For curing the binder system, a suited aliphatic or aromatic polyisocyanate resin-based hardener can be added just before printing. Where needed, the viscosity suited for application, such as by printing, is adjusted by adding a diluting agent such as ethyl acetate. The preceding measures permit to formulate the composite material as an electrically conductive paste.

Screen-printing has been found to be particularly suited as a printing method. Basically, gravure printing may also be utilized. A wet coating thickness of about 10 µm has been found to suffice. A freshly printed antenna structure dried at room temperature does not yet have measurable electric conductivity and is therefore not suited for use as an antenna in a transponder. Only subsequent metal plating makes the antenna operative. The additional treatment of the invention with halide ions is necessary in particular when used in the UHF range.

After formation, the pattern formed by the composite material can be gelled preferably at room temperature. Next, the pattern is brought into contact with the halide ions and finally metal is deposited. If the time elapsed between pattern printing and metal deposition thereon is more than two hours, the halide ions additionally prevent the otherwise delayed deposition during charge exchange and cause the metal to deposit immediately after the pattern has been brought into contact with the solution.

After metal deposition, the coated pattern is tempered preferably at increased temperature. The tempering temperature is just low enough for the carrier substrate not to be impaired (base material tolerated tempering). This tempering treatment may take place immediately after metal deposition at about 120 to about 140° C. if polyethylene terephthalate is used as the carrier substrate and may last for about 2 to about 3 min. During this period of time, the dispersed metal particles, more specifically iron particles, and the metal nuclei, more specifically the copper nuclei, generated during the charge exchange reaction are reliably incorporated in a thermally crosslinking polymer matrix of the binder in the composite material.

If the metal layer formed by means of the ion exchange reaction is to be reinforced even more, this may be achieved by electroless metal deposition (without external current source) and/or by electroplating, for example by copper electroplating, such as in an acidic copper plating bath containing either sulfuric acid, methane sulfonic acid, amidosulfuric acid or pyrophosphoric acid or a mixture of some or of all of these acids. For metal deposition by electroplating onto such type patterns applied to a tape-type carrier substrate, the apparatus described in DE 103 42 512 A can be used, said apparatus being provided with at least one contacting electrode for the workpiece and at least one electrolysis region in which at least one counter electrode and the workpiece are brought into contact with processing liquid, with the contacting electrode being disposed outside of the electrolysis region and not contacting the processing liquid and said contacting electrode and said electrolysis region being spaced so close apart to allow for electrolytic treatment of small electrically conductive structures. It has been found advantageous to conclude with a thermal treatment at about 120° C. during about 2 to about 3 min after electroplating treatment in order to achieve uniform bonding strength. It has been found though that after metal deposition through charge exchange reaction the need for additional electroless metal deposition and/or metal deposition by electroplating can be readily obviated.

The carrier substrate preferably consists of at least one material that is selected from the group comprising polyethylene terephthalate, polyvinyl chloride, polycarbonate, polyethylene naphthalate and impregnated paper.

Prior to applying the pattern, the carrier substrate is usually cleaned and dried again at need. The same applies to the carrier substrate provided with the pattern. Between the treatment steps, the substrate is rinsed to remove adhering solution.

In case the pattern is reinforced by electroplating, the bonding strength on polyethylene terephthalate has been determined to be 4 N/cm$^2$ in the peel test. By contrast, with conductive silver pastes reinforced by electroplating, bonding strength values of only 2 N/cm$^2$ were achieved.

For better understanding of the invention, examples will be given herein after.

FIG. 1: shows a pattern for an antenna structure.

For all the following tests, the following conditions were chosen:

On a carrier foil consisting of a polyethylene terephthalate material an antenna structure for UHF operation was screen printed with a paste. The antenna structure is shown in FIG. 1. The antenna structure consists of two antenna branches 1, 2 that are solder-connected to a chip carrier strip 5 at connecting pads 3, 4. The chip carrier strip 5 carries a semiconductor component 6.

The paste contained about 70 wt.-% iron powder with a particle size of 2-6 µm, 24 wt.-% of a polyurethane resin-based binder to which a hardener and a diluting agent for adjusting the viscosity were added just before printing. The wet coating thickness was about 10 µm. After screen printing, the carrier substrate with the antenna structure printed thereon was gelled for 0.1-1 hour at room temperature.

Thereafter, the printed carrier substrate was treated according to Table 1.

The thus produced antenna structured on the carrier substrate was next solder-connected to a semiconductor component mounted to a chip carrier strip (UHF chip carrier strip with a Philips i-connect chip).

Next, the electric resistance between the two legs of a branch of the antenna structure was measured (at the locations labelled 3 and 7 in FIG. 1). Further, the achievable transmission distance was determined using a reader from SAMSys Technologies, Canada, which had an emitting power of 500 mW or 3 W.

Comparative Examples A Through C

Compositions of pre-immersion solutions that do not contain halide (Comparative Examples A and B) and a composition of a metal deposition solution containing halide ions (Comparative Example C) as well as the resistance values and peel test values obtained are set out in Table 2. In Comparative Examples A and B metal deposition solutions have been used which had the following composition: 216 g/l $CuSO_4.5\,H_2O$, 50 ml/l $H_2SO_4$, conc. In Comparative Example C no method step c) was performed, i.e., the carrier substrate was not pre-treated in a pre-immersion solution.

Using the Philips i-connect chips and a SAMSys 500 mW reader, no power transfer could be located with any of the antenna structures manufactured in Comparative Examples A and B. Consequently, the transmission distance was 0 m. The electric resistance values measured at the antenna structures produced according to Examples A, B and C were relatively high. Further, the bond strength of the pattern to the substrate was tested by applying an adhesive tape to the pattern and peeling same at approximately right angles off the substrate. If copper was observed to stick to the tape the bond strength was considered not to be sufficiently strong. As Table 2 indicates the bond strength was satisfactory in Comparative Examples A and B, but was not satisfactory in Comparative Example C.

Examples 1-18

Compositions of pre-immersion solutions of the invention containing halide as well as the resistance values obtained are set out in Table 3. The peel test obtained with all the antenna structures indicated a sufficiently strong bond of the deposited copper layer to the composite material.

From the test data it appears that, using a halide containing pre-immersion solution, the electric resistance is clearly reduced over using a pre-immersion solution without halide. If this pre-immersion solution contains no acid, the electric resistance is also slightly increased.

Example 19

In another example, the transmission distance was measured with antennae made according to the method of the invention. The manufacturing conditions were identical to the preceding conditions. The pre-immersion solution contained 250 ml/l $H_2SO_4$, conc., 10 g/l $FeCl_3.6\,H_2O$ (corresponding to Example 1).

Using a Philips i-connect chip and a SAMSys 500 mW reader, a continuous transmission distance of 1.42 m and a maximum transmission distance of 1.74 m were obtained by averaging with 12 antennae, and using a radiation power of the reader of about 3 W a maximum transmission distance of 4.02 m was acquired.

It is understood that the examples and embodiments described herein are for illustrative purpose only and that various modifications and changes in light thereof as well as combinations of features described in this application will be suggested to persons skilled in the art and are to be included within the spirit and purview of the described invention and within the scope of the appended claims. All publications, patents and patent applications cited herein are hereby incorporated by reference.

TABLE 1

| Process Sequence | | |
| --- | --- | --- |
| Treatment step | Treatment duration | Treatment temperature |
| Pre-immersion solution*) | 30 sec | [1])[2]) |
| Rinsing | 30 sec | RT[3]) |
| Depositing copper[4]) | 2 min | 40° C. |
| Rinsing | 30 sec | RT[3]) |
| Tempering | 5-10 min | 130° C. |

*)except for in Comparative Example C
[1])varies
[2])slight air injection
[3])room temperature
[4])216 g/l $CuSO_4 \cdot 5H_2O$, 50 ml/l $H_2SO_4$, conc. in water, except for in Comparative Example C

TABLE 2

Compositions and Resistance Values with no Halide in the Pre-Immersion Solution

| Test No. | Composition | Resistance | Peel Test |
| --- | --- | --- | --- |
| A | 250 ml/l $H_2SO_4$, conc., 17.1 g/l $FeSO_4 \cdot 7H_2O$ | 196.0 Ω | ok |
| B | 250 ml/l $H_2SO_4$, conc., 28.66 g/l Fe(II) gluconate | 1250 Ω | ok |
| C | 250 ml/l $H_2SO_4$, conc., 10.0 g/l $FeCl_3 \cdot 6H_2O$, 130 g/l $CuSO_4 \cdot 5H_2O$ | 20-200 Ω | failed |

TABLE 3

Compositions and Resistance Values Using Halide in the Pre-Immersion Solution

| Test No. | Composition | Resistance |
| --- | --- | --- |
| 1 | 250 ml/l $H_2SO_4$, conc., 10 g/l $FeCl_3 \cdot 6H_2O$ | 2.9 Ω |
| 2 | 250 ml/l $H_2SO_4$, conc., 17.1 g/l $FeSO_4 \cdot 7H_2O$, 10.8 g/l NaCl | 1.65 Ω |
| 3 | 250 ml/l $H_2SO_4$, conc., 28.66 g/l Fe(II) gluconate, 10.8 g/l NaCl | 1.42 Ω |
| 4 | 250 ml/l $H_2SO_4$, conc., 17.1 g/l $FeSO_4 \cdot 7H_2O$, 10.8 g/l NaCl, 2 ml/l 2A1[1]) | 1.46 Ω |
| 5 | 250 ml/l $H_2SO_4$, conc., 28.66 g/l Fe(II) gluconate, 10.8 g/l NaCl, 2 ml/l 2A1[1]) | 1.35 Ω |
| 6 | 250 ml/l $H_2SO_4$, conc., 10.8 g/l NaCl | 1.88 Ω |
| 7 | 250 ml/l $H_2SO_4$, conc., 10.8 g/l NaCl | 5.53 Ω[2]) |
| 8 | 250 ml/l $H_2SO_4$, conc., 10.8 g/l NaCl, 28.66 g/l Fe(II) | 2.96 Ω |

TABLE 3-continued

Compositions and Resistance Values Using Halide in the Pre-Immersion Solution

| Test No. | Composition | Resistance |
|---|---|---|
| | gluconate | |
| 9 | 37 wt.-% HCl | 1.98 Ω |
| 10 | 9.7 g/l KBr | 350 Ω |
| 11 | 250 ml/l $H_2SO_4$, conc., 9.7 g/l KBr | 2.95 Ω |
| 12 | 250 ml/l $H_2SO_4$, conc., 9.7 g/l KBr, 28.66 g/l Fe(II) gluconate | 2.08 Ω |
| 13 | 250 ml/l $H_2SO_4$, conc., 9.7 g/l KBr, 28.66 g/l Fe(II) gluconate | 3.83 Ω[2]) |
| 14 | 9.7 g/l KBr, 28.66 g/l Fe(II) gluconate | ≦90.8 Ω |
| 15 | 250 ml/l $H_2SO_4$, conc., 9.7 g/l KBr, 28.66 g/l Fe(II) gluconate | 1.86 Ω |
| 16 | 250 ml/l $H_2SO_4$, conc., 9.7 g/l KBr, 28.66 g/l Fe(II) gluconate, 10.8 g/l NaCl | 1.96 Ω |
| 17 | 250 ml/l $H_2SO_4$, conc., 8.5 g/l KI | 1.58 Ω |
| 18 | 250 ml/l $H_2SO_4$, conc., 9.7 g/l KBr, 28.66 g/l Fe(II) gluconate | 1.85 Ω |

[1])Wetting agent
[2])in the tests 8 and 13, the pattern formed by screen printing the composite material onto the substrate was aged for 19 hours.

The invention claimed is:

1. A method of manufacturing a pattern-forming metal structure on a carrier substrate, comprising the following steps:
   a. providing the carrier substrate;
   b. forming a pattern on the carrier substrate with a composite material containing dispersed metal;
   c. bringing the pattern on the carrier substrate into contact an acid and halide ions; and
   d. following c), depositing a metal layer onto the pattern formed by the composite material by a charge exchange reaction, producing thereby the metal structure.

2. The method according to claim 1, characterized in that the halide ions are chloride ions, bromide ions or iodide ions.

3. The method according to claim 1, characterized in that the metal deposited in step d) is copper.

4. The method according to claim 3, characterized in that the copper is deposited by means of an acidic solution.

5. The method according to claim 4, characterized in that the acidic solution contains sulfuric acid.

6. The method according to claim 3, characterized in that the copper is deposited by means of a solution containing at least one complexing agent for copper.

7. The method according to claim 3, characterized in that the metal dispersed in the composite material is less noble than copper.

8. The method according to claim 1, characterized in that the composite material contains at least one dispersed metal selected from iron, iron base alloys, zinc and zinc base alloys.

9. The method according to claim 1, characterized in that the dispersed metal is iron.

10. The method according to claim 8, characterized in that the iron is made from iron carbonyl.

11. The method according to claim 1, characterized in that the dispersed metal has a particle size not exceeding 6 μm.

12. The method according to claim 1, characterized in that the composite material additionally contains conductive carbon particles.

13. The method according to claim 1, characterized in that the pattern-forming composite material is gelled at room temperature.

14. The method according to claim 1, characterized in that the metal layer deposited onto the composite material is tempered at increased temperature.

15. The method according to claim 14, characterized in that the tempering temperature is just low enough not to impair the carrier substrate.

16. The method according to claim 1, characterized in that the metal layer is deposited onto the composite material with a thickness not exceeding 5 μm.

17. The method according to claim 1, characterized in that the composite material contains at least one binder selected from epoxy resins, polyurethane resins and acrylic resins.

18. The method according to claim 1, characterized in that the composite material is a conductive paste.

19. The method according to claim 1, characterized in that the pattern is formed on the carrier substrate by printing.

20. The method according to claim 1, characterized in that the pattern is formed on the carrier substrate by screen printing.

21. The method according to claim 1, characterized in that the carrier substrate consists of at least one material selected from polyethylene terephthalate, polyvinyl chloride, polycarbonate, polyethylene naphthalate and impregnated paper.

22. The method according to claim 1, characterized in that the pattern is an antenna structure.

23. The method according to claim 22, characterized in that the antenna structure has connecting pads provided for contacting a semiconductor component.

24. The method according to claim 22, characterized in that the antenna structure is suited for UHF reception.

25. The method according to claim 1, characterized in that the metal structure is suited for manufacturing antennae for RFID use.

26. The method according to claim 9, characterized in that the iron is made from iron carbonyl.

27. A method of manufacturing a pattern-forming metal structure on a carrier substrate, comprising the following steps:
   a. providing the carrier substrate;
   b. forming a pattern on the carrier substrate with a composite material containing dispersed metal;
   c. bringing the pattern on the carrier substrate into contact with an acid and halide ions; and
   d. immediately following step c), depositing a metal layer onto the pattern formed by the composite material by a charge exchange reaction, producing thereby the metal structure.

28. The method of claim 1, characterized in that in step c), the acid and the halide ions are provided as hydrochloric acid.

* * * * *